(12) United States Patent
Chang et al.

(10) Patent No.: US 8,853,790 B2
(45) Date of Patent: Oct. 7, 2014

(54) SEMICONDUCTOR NANOWIRE STRUCTURE REUSING SUSPENSION PADS

(75) Inventors: Josephine B. Chang, Mahopac, NY (US); Michael A. Guillorn, Yorktown Heights, NY (US); Isaac Lauer, Mahopac, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 280 days.

(21) Appl. No.: 13/080,390

(22) Filed: Apr. 5, 2011

(65) Prior Publication Data
US 2012/0256242 A1 Oct. 11, 2012

(51) Int. Cl.
| | |
|---|---|
| *H01L 51/48* | (2006.01) |
| *H01L 29/786* | (2006.01) |
| *H01L 27/12* | (2006.01) |
| *H01L 29/06* | (2006.01) |
| *B82Y 10/00* | (2011.01) |
| *H01L 29/423* | (2006.01) |
| *H01L 21/84* | (2006.01) |

(52) U.S. Cl.
CPC ...... *H01L 27/1203* (2013.01); *H01L 29/78696* (2013.01); *H01L 29/0673* (2013.01); *B82Y 10/00* (2013.01); *H01L 29/42392* (2013.01); *H01L 21/84* (2013.01)
USPC .................... 257/379; 257/577; 257/E21.351

(58) Field of Classification Search
CPC ............ H01L 51/0045; H01L 51/4266; H01L 51/0048
USPC ................................................ 257/379, 577
See application file for complete search history.

(56) References Cited

U.S. PATENT DOCUMENTS

| | | | |
|---|---|---|---|
| 4,560,583 A * | 12/1985 | Moksvold ...................... 438/11 |
| 5,281,835 A * | 1/1994 | Tomita et al. ................. 257/204 |
| 6,294,834 B1 | 9/2001 | Yeh et al. |
| 6,552,372 B2 * | 4/2003 | Wu et al. ....................... 257/173 |
| 6,586,311 B2 | 7/2003 | Wu |
| 7,166,904 B2 | 1/2007 | Gill et al. |
| 7,560,784 B2 | 7/2009 | Cheng et al. |
| 2005/0275010 A1 * | 12/2005 | Chen et al. ..................... 257/315 |
| 2006/0172497 A1 * | 8/2006 | Hareland et al. .............. 438/286 |
| 2007/0001232 A1 * | 1/2007 | King et al. ..................... 257/368 |
| 2008/0135949 A1 | 6/2008 | Lo et al. |
| 2010/0193770 A1 | 8/2010 | Bangsaruntip et al. |
| 2010/0207208 A1 | 8/2010 | Bedell et al. |
| 2010/0319847 A1 * | 12/2010 | Cok et al. ................... 156/272.8 |

OTHER PUBLICATIONS

K.D. Buddharaju et al., "Gate-All-Around Si-Nanowire CMOS Inverter Logic Fabricated Using Top-down Approach," European Solid-State Device Research Conference, pp. 303-306, Sep. 2007.
K.W. Cho et al., "Observation of Single Electron Tunneling and Ballistic Transport in Twin Silicon Nanowire MOSFETs (TSNWFETs) Fabricated by Top-Down CMOS Process," International Electron Devices Meeting, IEDM, pp. 1-4, 2006.
H. Zhao et al., "Characterization and Modeling of Subfemtofarad Nanowire Capacitance Using the CBCM Technique," IEEE Electron Device Letters, vol. 30, No. 5, pp. 526-528, 2009.

* cited by examiner

*Primary Examiner* — Julio J Maldonado
*Assistant Examiner* — Mohammad Choudhry
(74) *Attorney, Agent, or Firm* — Cantor Colburn LLP; Vazken Alexanian

(57) ABSTRACT

An integrated circuit apparatus is provided and includes first and second silicon-on-insulator (SOI) pads formed on an insulator substrate, each of the first and second SOI pads including an active area formed thereon, a nanowire suspended between the first and second SOI pads over the insulator substrate, one or more field effect transistors (FETs) operably disposed along the nanowire and a planar device operably disposed on at least one of the respective active areas formed on each of the first and second SOI pads.

21 Claims, 11 Drawing Sheets

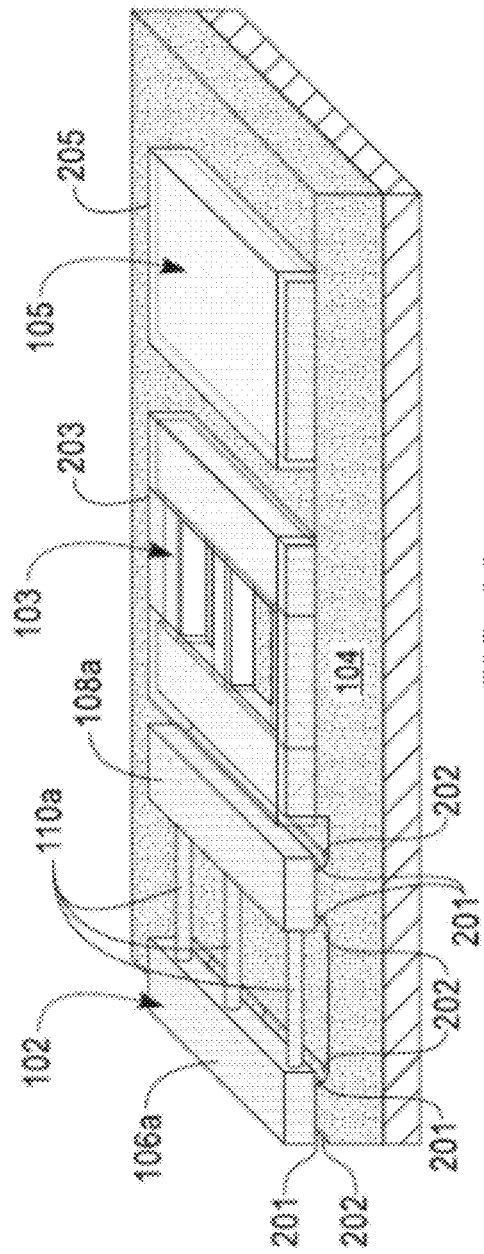
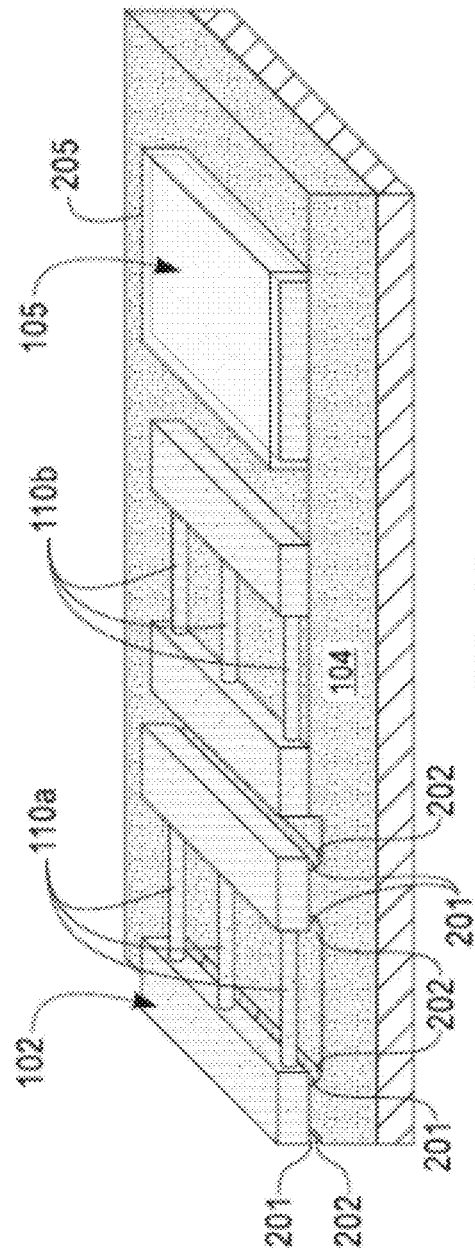
FIG. 2A
FIG. 2B

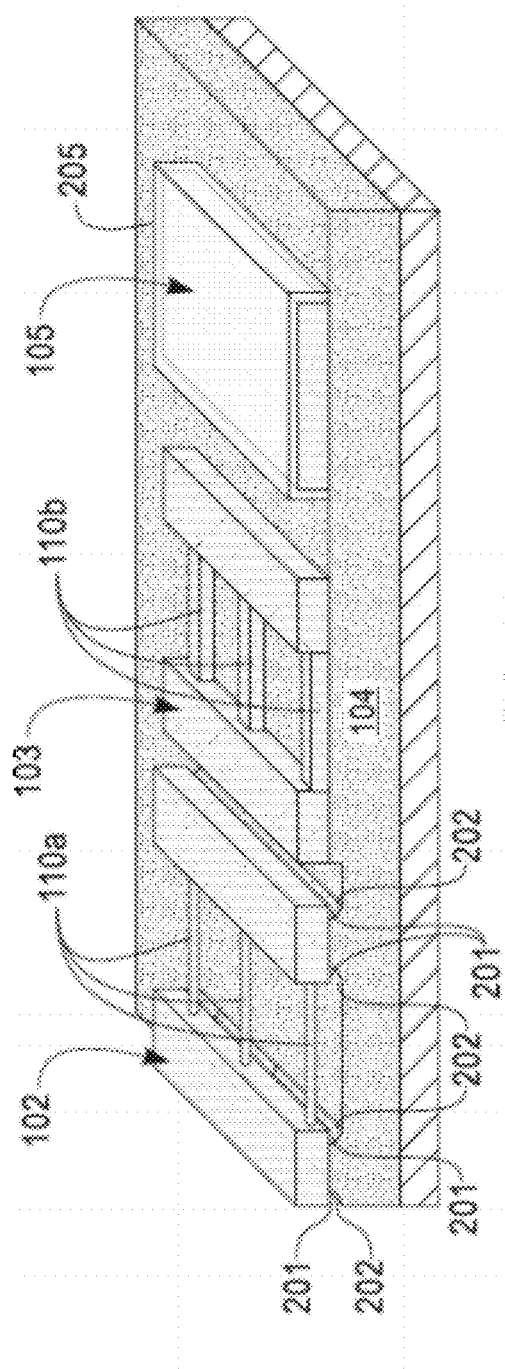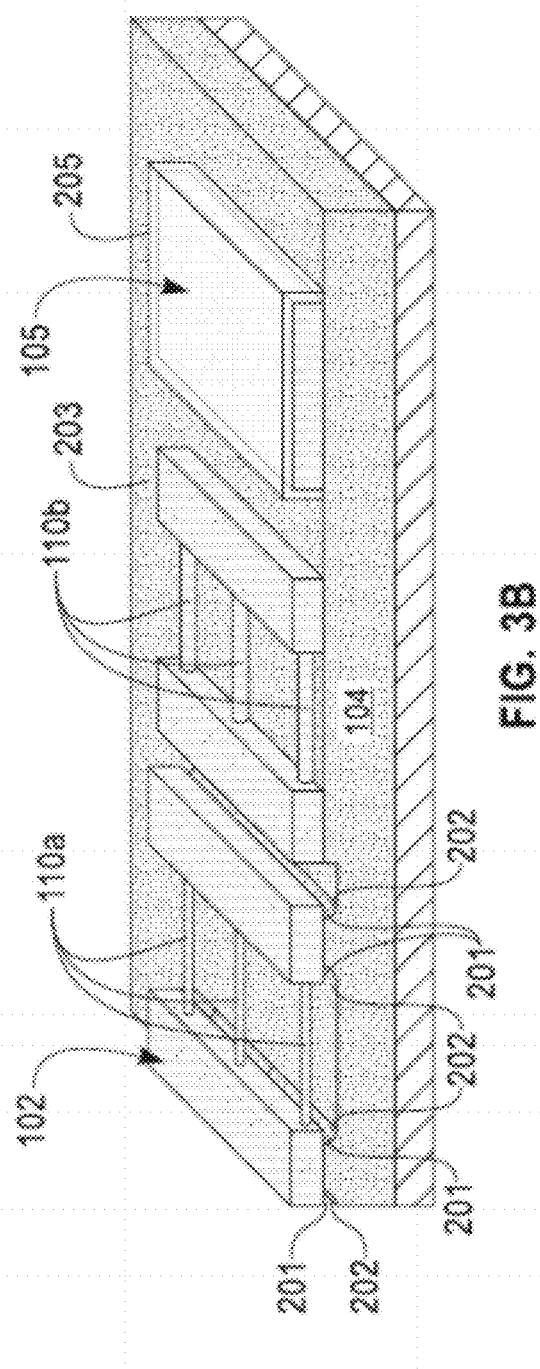

SEMICONDUCTOR NANOWIRE STRUCTURE REUSING SUSPENSION PADS

BACKGROUND

The present invention relates to semiconductor nanowire field effect transistors and planar field effect transistors.

In the formation of top-down nanowire devices, a pad region is typically required to anchor the nanowire field effect transistor (FET) during suspension processes. This pad region consumes area and therefore has a negative impact upon density. While various techniques have been proposed to either eliminate the pad and/or reduce its area impact, all of these solutions come with their own added complexities.

SUMMARY

In accordance with one aspect of the present invention, an integrated circuit apparatus is provided and includes first and second silicon-on-insulator (SOI) pads formed on an insulator substrate, each of the first and second SOI pads including an active area formed thereon, a nanowire suspended between the first and second SOI pads over the insulator substrate, one or more field effect transistors (FETs) operably disposed along the nanowire and a planar device operably disposed on at least one of the respective active areas formed on each of the first and second SOI pads.

In accordance with another aspect of the present invention, a method for forming an integrated circuit is provided and includes forming first and second silicon-on-insulator (SOI) pads on an insulator substrate, suspending a nanowire between the first and second SOI pads above the insulator substrate, forming a field effect transistor (FET) along the nanowire and forming a planar device on at least one respective active area formed on each of the first and second SOI pads.

In accordance with yet another aspect of the present invention, a method for forming an integrated circuit is provided and includes forming first and second silicon-on-insulator (SOI) pads on an insulator substrate, suspending one or more nanowires between the first and second SOI pads above the insulator substrate in a ladder formation, forming one or more field effect transistors (FETs) along each of the one or more nanowires and forming a planar device on each respective active area formed on each of the first and second SOI pads.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2A is a perspective view of nanowires formed at a portion of the SOI portions of FIG. 1;

FIG. 2B is a perspective view of nanowires formed at a portion of the SOI portions of FIG. 1;

FIG. 3A is a perspective view of thinned nanowires;

FIG. 3B is a perspective view of thinned nanowires;

DETAILED DESCRIPTION

An integrated circuit may include a number of different types of field effect transistor (FET) devices. Examples of FET devices include a planar channel FET, and a nanowire channel FET. A planar channel FET includes a silicon slab, a gate line formed over the silicon slab, a source region and a drain region adjacent to the gate line, and a channel region near the surface of the slab under the gate. The channel electrically connects the source region to the drain region while the gate controls the current in the channel. A nanowire channel FET includes silicon nanowires that connect on each side to a source region and a drain region, and a gate line that fully (or partially) surrounds the nanowires. The channel forms at the surface of the nanowires under the gate (or in the bulk of the nanowires for nanowires with diameter smaller than about 5 nm). When the gate fully surrounds the nanowire, the device is referred to as a gate-all-around (GAA) FET. When the gate partially surrounds the nanowires, as in the case when the nanowire is attached to an insulator, the device is referred to as an omega-gate FET.

Figure 1:
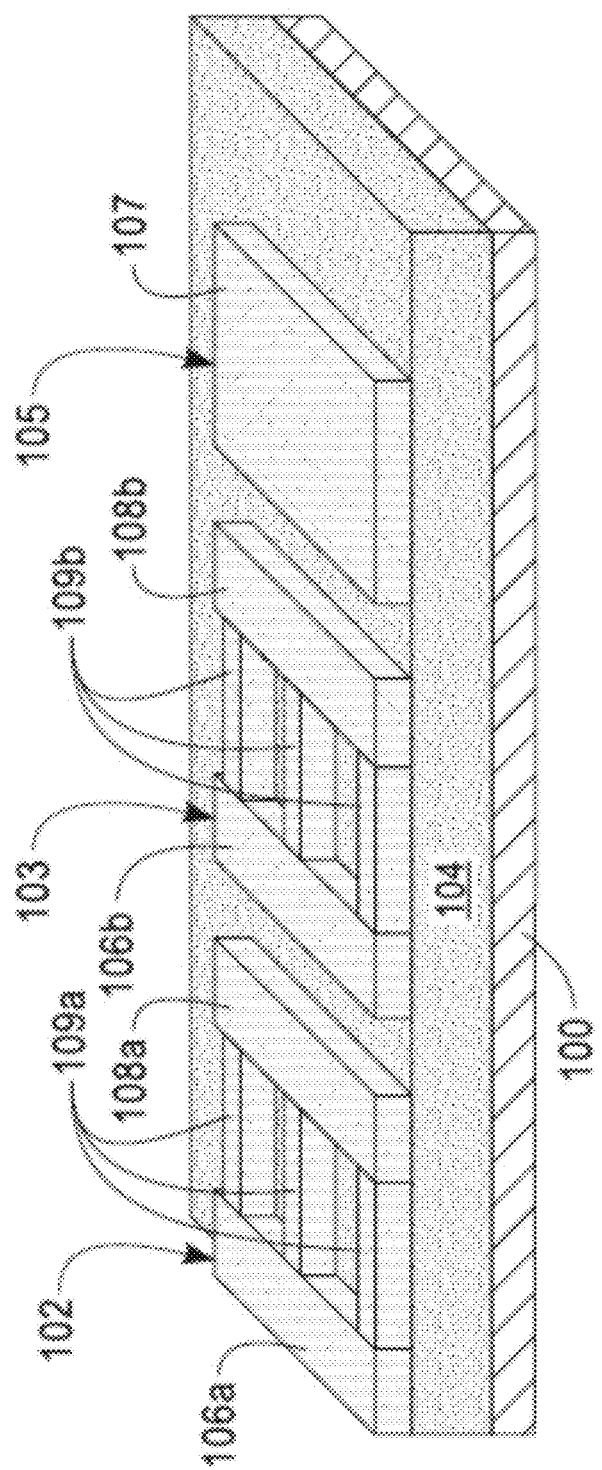
FIG. 1 is a perspective view of silicon-on-insulator (SOI) portions formed on a buried oxide layer.

With reference now to FIG. 1, silicon-on-insulator (SOI) portions 102, 103, and 105 may be defined on a buried oxide (BOX) layer 104 that is disposed on a silicon substrate 100. The SOI portion 102 is to be used to fabricate a gate all-around nanowire FET device and includes an SOI pad region 106a, an SOI pad region 108a and nanowire portions 109a. The SOI portion 103 is to be used to fabricate an omega-gate nanowire FET device and includes an SOI pad region 106b, an SOI pad region 108b and nanowire portions 109b. The SOI portion 105 is to be used to fabricate a planar FET device and includes an SOI pad 107. The SOI portions 102, 103, and 105 may be patterned by, for example, the use of lithography followed by an etching process such as, for example, reactive ion etching (RIE).

FIG. 2A illustrates a resultant BOX layer 104 and SOI portion 102 following an isotropic etching process. In the illustrated embodiment, a hardmask layer 203 including, for example, silicon nitride ($Si_3N_4$), has been disposed on the SOI portion 103 and protects the SOI portion 103 during the isotropic etching process. In the illustrated embodiment, the SOI portion 105 is covered with a hardmask layer 205 that similarly protects the SOI portion 105. In alternate embodiments, the hardmask layer 205 may not be disposed on the SOI portion 105. If the hardmask layer 205 is not disposed on the SOI portion 105, portions of the BOX layer 104 will be removed in the isotropic etching process by laterally etching portions of the BOX layer 104 under the edges of the SOI portion 105 resulting in undercuts similar to the undercuts 202 (described below). The BOX layer 104 is recessed in regions not covered by SOI portion 102. The isotropic etching results in the lateral etching of portions of the BOX layer 104 that are under the SOI portion 102. The lateral etch suspends the nanowires 109a above the BOX layer 104. The lateral etch forms the undercuts 202 in the BOX layer 104 and overhang portions 201 at the edges of SOI regions 106a and 108a. The isotropic etching of the BOX layer 104 may be performed, for example, by using a diluted hydrofluoric acid (DHF). A 100:1 DHF etches approximately 2 to 3 nm of BOX layer 104 per minute at room temperature.

Following the isotropic etching of the BOX, 104 the nanowire portions 109a (of FIG. 1) are smoothed to form elliptical shaped (and in some cases, cylindrical shaped) nanowires 110a that are suspended above the BOX layer 104 by support provided by the SOI pad region 106a and the SOI pad region 108a. The smoothing of the nanowires 109a may be performed by, for example, annealing of the nanowires 109a in hydrogen. Example annealing temperatures may be in the range of about 600° C.-1000° C., and an appropriate hydrogen pressure. In the illustrated embodiment, the hardmask layer 203 on the SOI portion 103 and the hardmask layer 205 on the SOI portion 105 are present during the annealing of the nanowires 109a.

FIG. 2B illustrates an example of the alternate resultant structure when the hardmask layer 203 on the SOI portion 103 is removed prior to the annealing process described above. During the annealing process, the nanowires 109b are smoothed to form elliptical shaped nanowires 110b that are disposed in contact with the BOX layer 104. Though the illustrated embodiments include the hardmask layer 205 on the SOI portion 105 present during the annealing process, alternate embodiments may include removing the hardmask layer 205 from the SOI portion 105 prior to the annealing process. The annealing process will affect the exposed SOI portion 105.

FIG. 3A illustrates an optional process in which nanowires 110a are thinned. The reduction of the dimensions of the nanowires 110a may be performed by, for example, a high temperature oxidation of the nanowires 110a followed by etching of the grown oxide. The oxidation and etching process may be repeated to achieve desired nanowire 110a dimensions. Once the dimensions of the nanowires 110a have been reduced, gates (described below) are formed over the channel regions of the nanowires 110a and 110b.

FIG. 3B illustrates the nanowires 110a (of FIG. 2B) following an oxidation process that reduces the dimensions similar to the oxidation process described above in FIG. 3A. Once the desired dimensions of nanowires 110a are achieved, the process steps described below may be performed simultaneously on all of the devices.

Figure 4A:
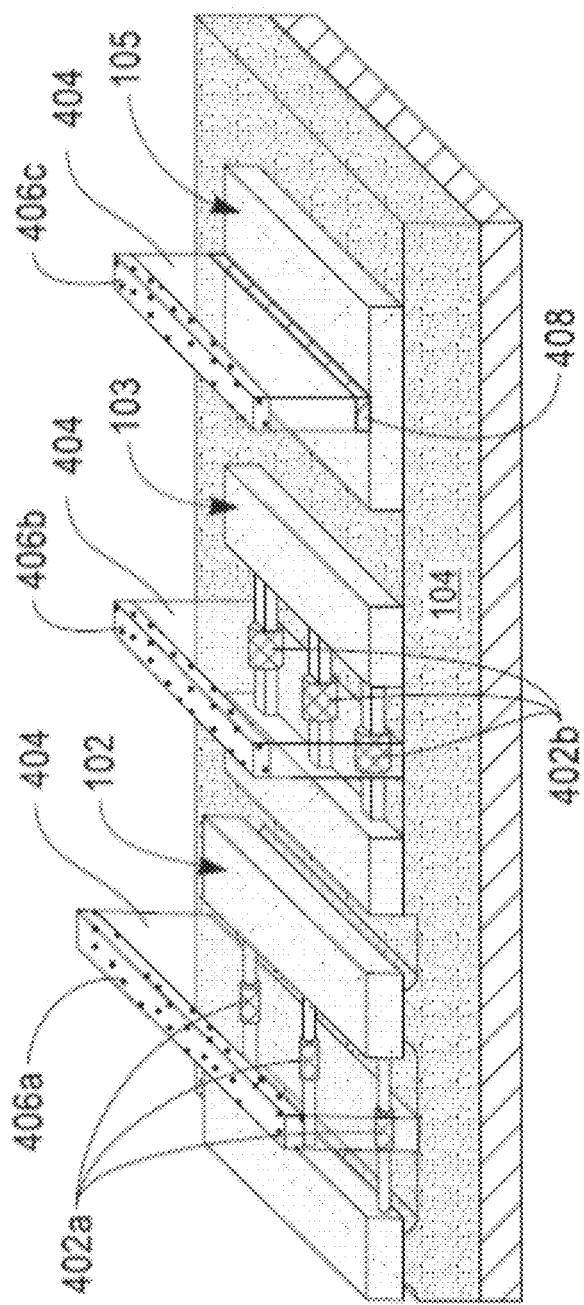
FIG. 4A illustrates the formation of gate stacks.
Figure 4B:
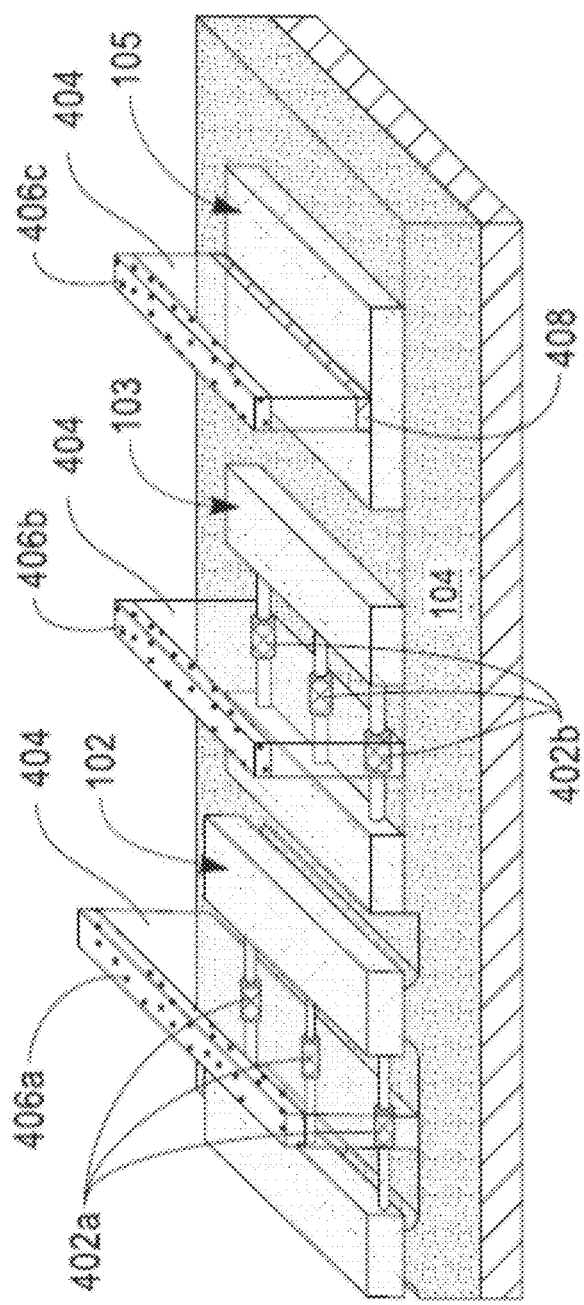
FIG. 4B illustrates the formation of gate stacks.

FIG. 4A illustrates gates 402a and 402b and 408 formed around the nanowires 110a and 110b and over SOI slab 105, as described in further detail below, and capped with polysilicon layer 404. Hardmask lines 406a, 406b and 406c are defined by patterning, for example, a silicon nitride ($Si_3N_4$) layer that is deposited over the polysilicon layer 404. The polysilicon layer 404 and the hardmask lines 406a, 406b and 406c may be formed by depositing polysilicon material over the BOX layer 104 and the SOI portions 102, 103 and 105, depositing the hardmask material over the polysilicon material and etching by RIE to form the polysilicon lines 404a, 404b and 404c illustrated in FIG. 4A. The etching of the gates 402a, 402b and 408 may be performed by directional etching that results in straight sidewalls of the gates 402a, 402b and 408. Following the directional etching, polysilicon remains under the nanowires 110a in regions not masked by the hardmask 406a. Isotropic etching may be performed to remove this polysilicon from under the nanowires 110a. FIG. 4B illustrates the nanowires 110a and 110b that are formed using a similar process as described above in FIG. 4A following the oxidation process of FIG. 3B.

Though the methods as described above illustrate the fabrication of a single row of gates, similar methods described herein may be used to form any number of devices on a nanowires 110a, and 110b between SOI pad regions 106a and 108a and 106b and 108b and the SOI portion 105.

Figure 5A:
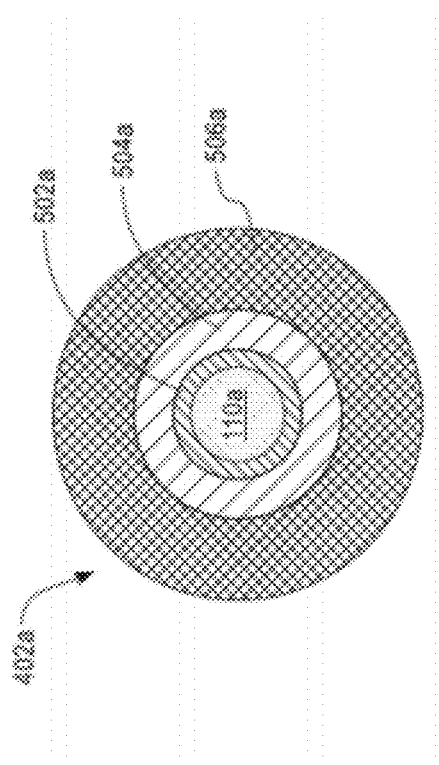
FIG. 5A is an axial view of the gate stacks.
Figure 5B:
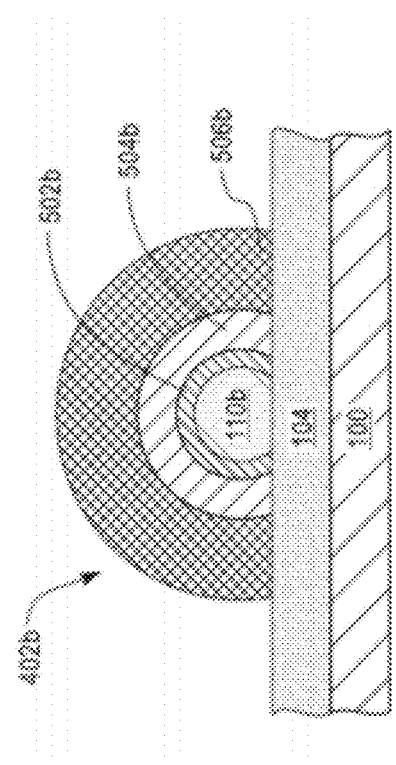
FIG. 5B is an axial view of the gate stacks.

With reference to FIGS. 5A and 5B, the gate stack 402a, 402b and 408 is formed by depositing a conformal gate dielectric film 502a such $SiO_2$, SiON, or $HfO_2$ (or other high-K material) around the nanowires 110a. A second conformal gate dielectric film 504a may also be applied. A metal gate film 506a such as, for example, TaN or TN, is deposited over the gate dielectric. Polysilicon 404 is then deposited over the metal gate film 506a.

FIG. 5A illustrates a cross sectional view of a gate 402a along the line A-A (of FIG. 4B). The gate 402a is formed by depositing a first gate dielectric layer 502a, such as silicon dioxide ($SiO_2$) around the nanowire 110a. A second gate dielectric layer 504a such as, for example, hafnium oxide ($HfO_2$) is formed around the silicon oxide layer 502a. A metal layer 506a such as, for example, tantalum nitride (TaN) is formed around the dielectric layer 504a. The metal layer 506a is surrounded by polysilicon layer 404a (of FIG. 4B). Doping the polysilicon layer 404a with impurities such as boron (p-type), or phosphorus (n-type) makes the polysilicon layer 404a conductive.

FIG. 5B illustrates a cross sectional view of a gate 402b along the line B-B of FIG. 4B formed by a similar process as described above, and including first gate dielectric layer 502b around the nanowire 110b, second gate dielectric layer 504b, and a metal layer 506b surrounded by the polysilicon layer 404b. The gate stack 408 includes the dielectric layer disposed on the SOI portion 105, the second gate dielectric layer 504, and the metal layer 506 that is capped by polysilicon 404. Since the channel of device 105 is planar as it forms in a planar SOI slab, the films comprising gate stack 408 also have a planar geometry.

Figure 6:
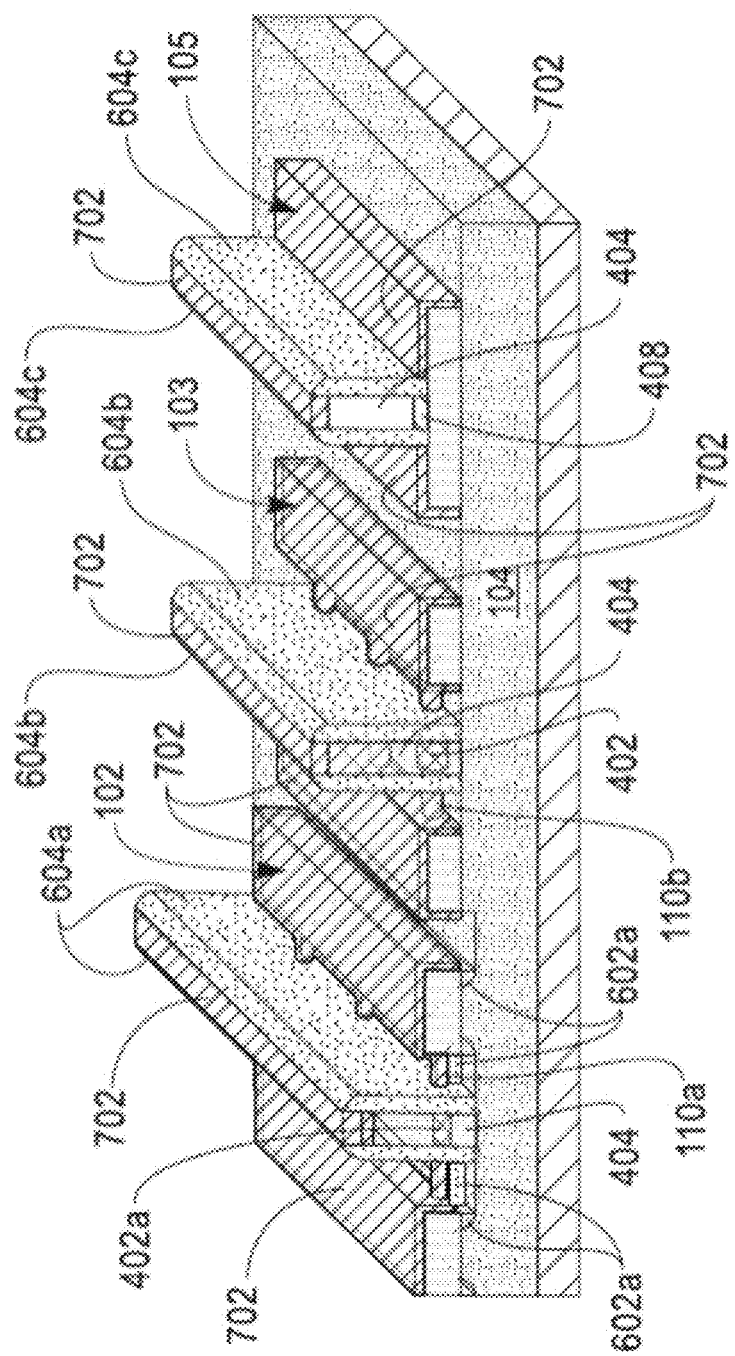
FIG. 6 is a perspective view illustrating resultant structures following a selective epi-silicon growth that thickens exposed nanowire portions not covered by gates.

FIG. 6 illustrates the spacer portions 604a, 604b and 604c formed along opposing sides of the polysilicon lines 404a, 404b and 404c. The spacers 604a, 604b and 604c are formed by depositing a blanket dielectric film such as silicon nitride and etching the dielectric film from all horizontal surfaces by RIE. The spacers 604a and 604b are formed around portions of the nanowires 110a and 110b that extend from the polysilicon layers 404a and 104b and surround portions of the nanowires 110a and 110b. Spacer portions 602a are formed under the nanowires 110a and in the undercut regions 202 (of FIG. 2).

FIG. 6 further illustrates the resultant structures following a selective epi-silicon growth that thickens the exposed nanowire portions not covered by the gate 404 and spacers 604a, 604b and 604c. The epitaxial growth 702 thickens the SOI pads 106a, 108a, 106b, 108b and portions of SOI 105 not covered by the gate 404 and spacers 604c. The epitaxial growth 702 may merge the adjacent nanowires 110 together with epi-silicon. The thickened/merged nanowires and SOI regions are formed by epitaxially growing, for example, in-situ doped silicon (Si) or a silicon germanium (SiGe) that may be either n-type or p-type doped. The in-situ doped epi process forms the source region and the drain region of the nanowire FET. As an example, a chemical vapor deposition (CVD) reactor may be used to perform the epitaxial growth.

Precursors for silicon epitaxy include $SiCl_4$, $SiH_4$ combined with HCL. The use of chlorine allows selective deposition of silicon only on exposed silicon surfaces. A precursor for SiGe may be $GeH_4$, which may obtain deposition selectivity without HCL. Precursors for dopants may include $PH_3$ or $AsH_3$ for n-type doping and $B_2H_6$ for p-type doping. Deposition temperatures may range from 550° C. to 1000° C. for pure silicon deposition, and as low as 300° C. for pure Ge deposition.

Figure 7:
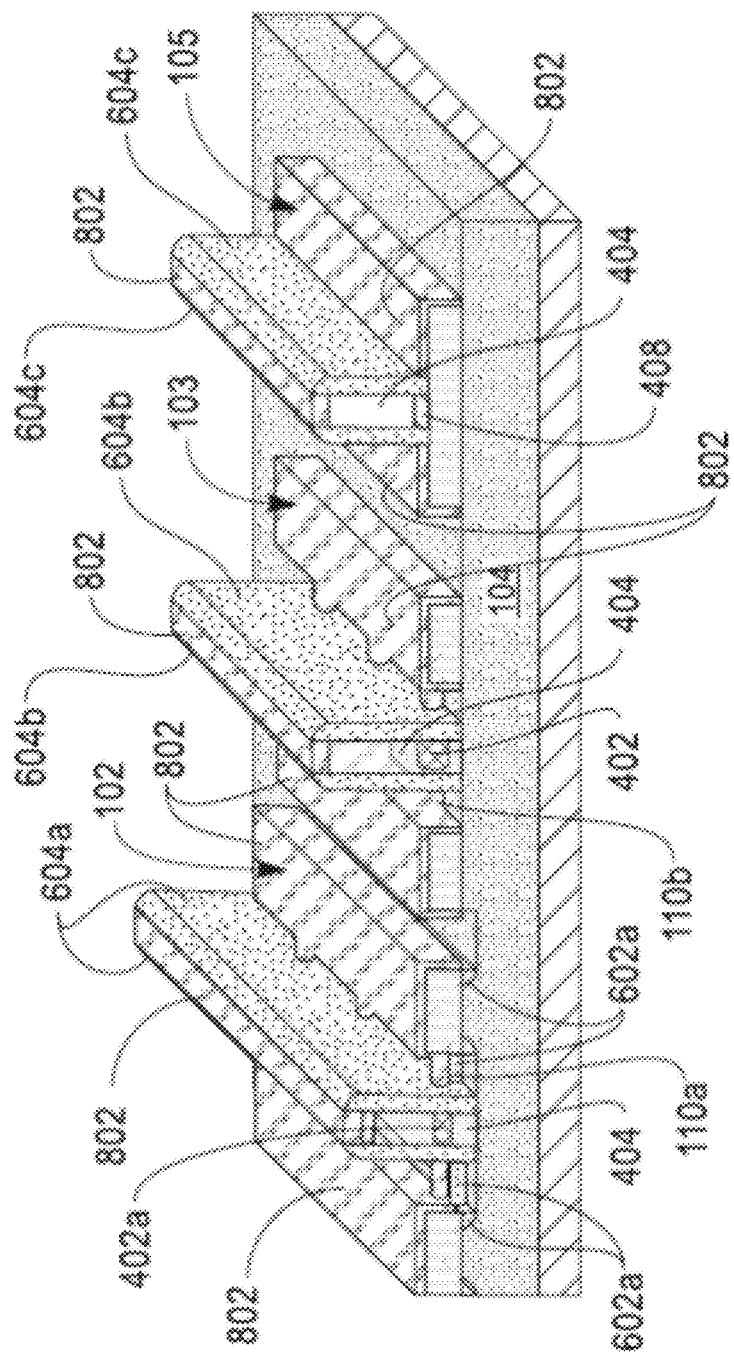
FIG. 7 is a perspective view illustrating a resultant structure following silicidation where a silicide is formed on exposed epitaxy.

FIG. 7 illustrates a resultant structure following silicidation where a silicide 802 is formed on the exposed epitaxy 702. Examples of silicide forming metals include Ni, Pt, Co, and alloys such as NiPt. When Ni is used the NiSi phase is formed due to its low resistivity. For example, formation temperatures include 400-600° C. Once the silicidation process is performed, capping layers and vias for connectivity (not shown) may be formed.

Figure 8:
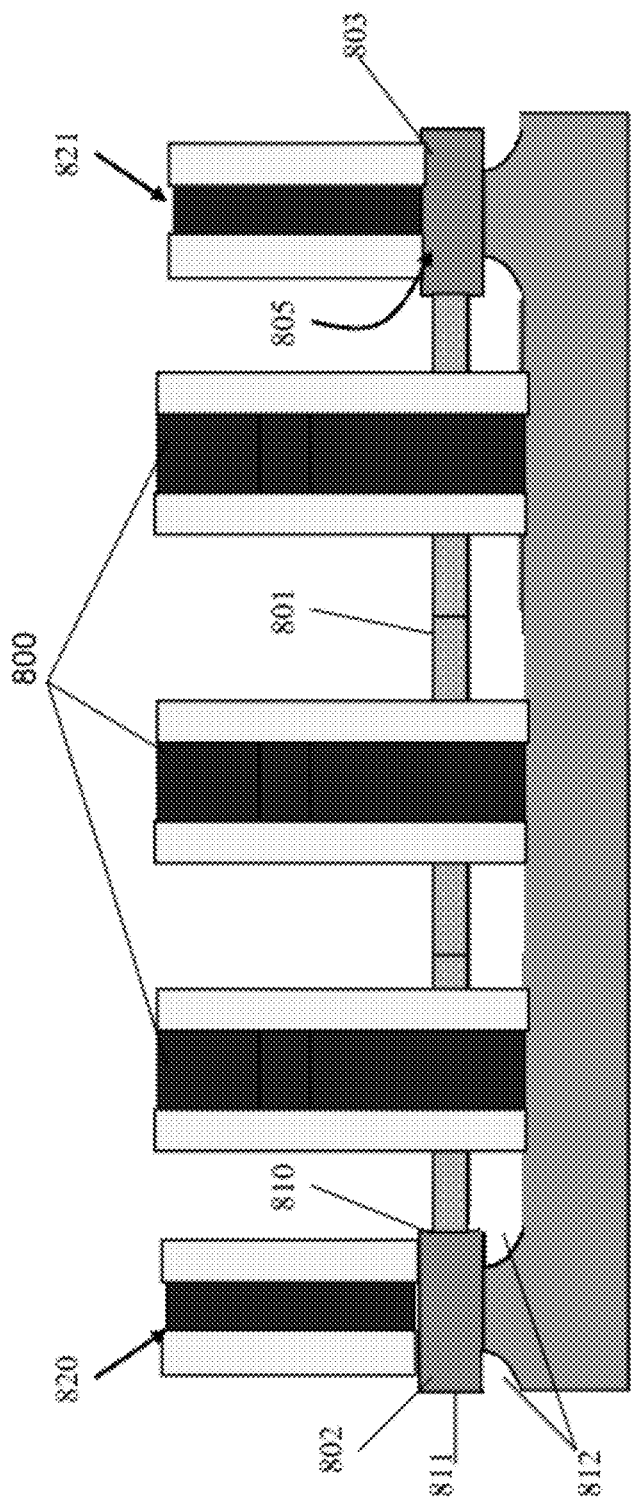
FIG. 8 illustrates a side view of planar FET devices formed on diffusion pads.

With reference to FIG. 8, the processes described above may be employed to form a device with one or more nanowire channel FETs 800, which are disposed along one or more nanowires 801 (in a ladder formation extending into and out of the image) that extend between first diffusion pad 802 and second diffusion pad 803. The first and second diffusion pads 802, 803 each have interior facing sidewalls 810, from which the one or more nanowires 801 extend, exterior facing sidewalls 811 that face away from one another and undercut regions 812 at the interior and exterior facing sidewalls 810, 811 that correspond to the undercuts 202 described above. As mentioned previously, these diffusion pads are typically unused and are associated with decreased device density and high costs. In accordance with aspects of the invention, however, devices may be provided on the pads with little negative effects and at little to no additional costs.

The first and second diffusion pads 802, 803 further include an active area 805 at, for example, respective top surfaces thereof. This active area 805 can be reused as described herein. Specifically, the active area 805 may be well suited for the formation of extremely thin, fully depleted SOI (ETSOI) devices (i.e., input/output (I/O) drivers), header and footer devices (i.e., power up/power down regions), decoupling capacitors and/or other passive devices (i.e., resistors).

For example, as shown in FIG. 8, first and second planar FETs 820, 821 can be formed on each of the first and second diffusion pads 802, 803, respectively. The first and second planar FETs 820, 821 can be formed substantially as described above and substantially simultaneously with the processes described above. Thus, the first and second planar FETs 820, 821 may be formed between for example the processes of FIGS. 3A and 3B and the processes of FIGS. 4A and 4. That is, the first and second planar FETs 820, 821 can be formed once the SOI pads 102, 103 and 105 are formed. In accordance with embodiments, the respective gate widths as measured in an out of the plane of the image of the first and second planar FETs 820, 821 are unconstrained and may be much larger that the gate widths of the nanowire channel FETs 800 as the full width of the first and second diffusion pads 802, 803 are available as an active gateable area.

Figure 9:
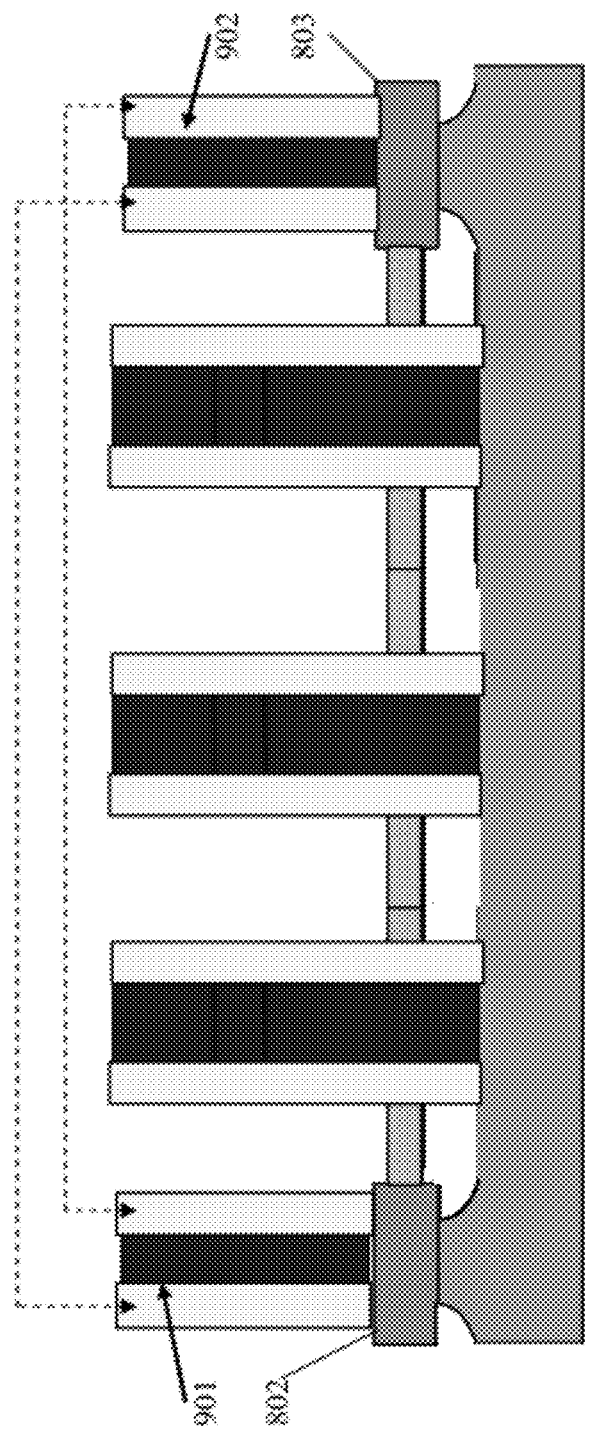
FIG. 9 illustrates a side view of FET devices with reused pads according to embodiments of the invention.

As another exemplary embodiment, shown in FIG. 9, first and second planar FET capacitors 901, 902 can be formed on the first and second diffusion pads 802, 803. The structure of this arrangement would be similar to that shown in FIG. 8, except that the respective sources of each of the first and second planar FET capacitors 901 and 902 are tied together in accordance with known structures and methods as one node while the respective drains of each of the first and second planar FET capacitors 901 and 902 are tied together in accordance with known structures and methods as another node. For this exemplary embodiment, relatively very large planar devices may be employed. That is, the respective gate widths as measured in an out of the image of the first and second planar FET capacitors 901, 902 may be much large than the gate widths of the nanowire channel FETs 800. In some cases, the total diffusion pad area of the first and second diffusion pads 802, 803 may be used. Additionally, the gate dielectric in the first and second planar FET capacitors 901, 902 may be relatively thick to thereby reduce gate leakage although this may not always be absolutely necessary.

Figure 10:
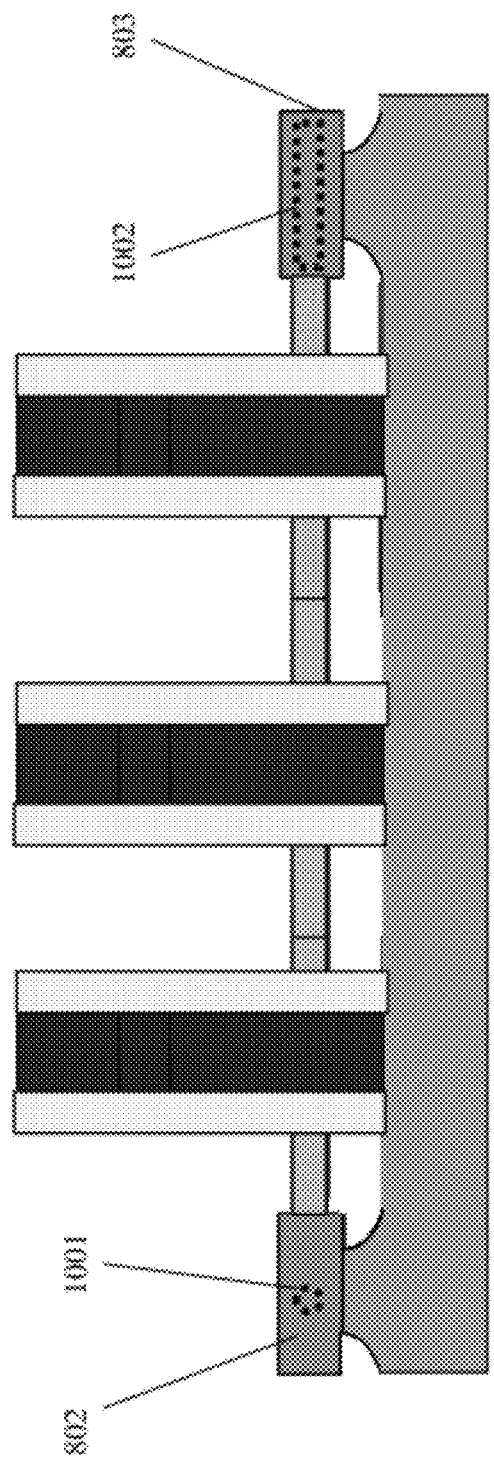
FIG. 10 illustrates a side view of FET devices with reused pads according to alternative embodiments of the invention.

As yet another exemplary embodiment, as shown in FIG. 10, first and second planar doped Si resistors 1001, 1002 may be placed on the first and second diffusion pads 802, 803, respectively. The doping may be accomplished via conventional diffusion doping techniques or by way of, for example, photolithography masking operations by which the first and second diffusion pads 802, 803 receive customized doping to achieve a desired resistance value. The first and second planar doped Si resistors 1001, 1002 would be formed between two contact vias or bars and could either be configured in a pad-edge to pad-edge formation (e.g., from the interior facing sidewall 810 to the exterior facing sidewall 811 in the plane of the image and transverse to a gate width direction) or along the pad (e.g., in a gate width direction in and out of the image plane). The resistivity of the doped silicon of the first and second diffusion pads 802, 803, as determined by the doping level, the thickness of the pad Si, and the actual resistor size can all be jointly and separately modified.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An integrated circuit apparatus, comprising:
   first and second silicon-on-insulator (SOI) pads formed on an insulator substrate, each of the first and second SOI pads including an interior facing surface that oppositely faces the interior facing surface of the other of the first and second SOI pads and a top surface having an active area formed thereon;
   a nanowire suspended between the respective interior facing surfaces of the first and second SOI pads over the insulator substrate;
   one or more field effect transistors (FETs) operably disposed along the nanowire between the first and second SOI pads; and
   a planar device operably disposed on at least one of the respective active areas formed on the respective top surfaces of each of the first and second SOI pads.

2. The integrated circuit apparatus according to claim 1, wherein each of the first and second SOI pads comprises the interior facing surface, an exterior facing surface opposite the interior facing surface, the top surface and an undercut region opposite the top surface.

3. The integrated circuit apparatus according to claim 2, wherein the respective active areas of each of the first and second SOI pads are formed on the respective top surfaces.

4. The integrated circuit apparatus according to claim 1, wherein the planar device comprises one or more of: an extremely thin, fully depleted SOI (ETSOI) device, a planar FET, a header device and a footer device.

5. The integrated circuit apparatus according to claim 1, wherein the planar device comprises a planar FET capacitor.

6. The integrated circuit apparatus according to claim 5, wherein a gate dielectric in the planar FET capacitor is thicker than a gate dielectric in the FET operably disposed along the nanowire.

7. The integrated circuit apparatus according to claim 1, wherein the planar device comprises a passive device.

8. The integrated circuit apparatus according to claim 1, wherein the planar device comprises a resistor.

9. The integrated circuit apparatus according to claim 8, wherein the resistor is formed to extend transversely with respect to a gate width direction.

10. The integrated circuit apparatus according to claim 8, wherein the resistor is formed to extend in a gate width direction.

11. The integrated circuit apparatus according to claim 1, wherein a gate width of the planar device is substantially similar to that of the corresponding one of the first and second SOI pads.

12. The integrated circuit apparatus according to claim 1, wherein the planar device is operably disposed on each of the respective active areas formed on each of the first and second SOI pads.

13. A method for forming an integrated circuit, the method comprising:
   forming first and second silicon-on-insulator (SOI) pads on an insulator substrate;
   suspending a nanowire between respective interior facing surfaces of the first and second SOI pads above the insulator substrate;
   forming a field effect transistor (FET) along the nanowire between the first and second SOI pads; and
   forming a planar device on at least one respective active area formed on a top surface of each of the first and second SOI pads.

14. The method according to claim 13, wherein the formation of the FET and the planar device are substantially simultaneous.

15. The method according to claim 13, wherein the forming of the planar device comprises forming a planar FET.

16. The method according to claim 13, wherein the forming of the planar device comprises forming a planar FET capacitor.

17. The method according to claim 13, wherein the forming of the planar device comprises forming a resistor.

18. The method according to claim 17, wherein the forming of the resistor comprises diffusion doping.

19. The method according to claim 17, wherein the forming of the resistor comprises photolithography masking operations.

20. A method for forming an integrated circuit, the method comprising:
   forming multiple sets of first and second silicon-on-insulator (SOI) pads on an insulator substrate;
   suspending one or more nanowires between respective interior facing surfaces of the first and second SOI pads above the insulator substrate in a ladder formation in each set;
   forming multiple field effect transistors (FETs) along each of the one or more nanowires and between the SOI pads in each set; and
   forming a planar device on each respective active area formed on a top surface of each of the first and second SOI pads in each set.

21. The method according to claim 20, wherein the planar device on each respective active area in each set comprises a source and a drain and further comprising;
   tying together the respective sources of each of the planar devices on each of the respective active areas; and
   tying together the respective drains of each of the planar devices on each of the respective active areas.

* * * * *